(12) United States Patent
Atesal et al.

(10) Patent No.: US 9,859,230 B2
(45) Date of Patent: Jan. 2, 2018

(54) HIGH ISOLATION WIDEBAND SWITCH

(71) Applicant: Analog Devices Global, Hamilton (BM)

(72) Inventors: Yusuf Alperen Atesal, Istanbul (TR); Turusan Kolcuoglu, Istanbul (TR)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/852,380

(22) Filed: Sep. 11, 2015

(65) Prior Publication Data

US 2016/0099220 A1 Apr. 7, 2016

Related U.S. Application Data

(60) Provisional application No. 62/058,507, filed on Oct. 1, 2014.

(51) Int. Cl.
*H01L 23/66* (2006.01)
*H01L 23/498* (2006.01)
(Continued)

(52) U.S. Cl.
CPC ........ *H01L 23/66* (2013.01); *H01L 23/49838* (2013.01); *H01L 23/642* (2013.01);
(Continued)

(58) Field of Classification Search
CPC ............. H01L 23/49838; H01L 23/642; H01L 23/645; H01L 23/66; H01L 24/49;
(Continued)

(56) References Cited

U.S. PATENT DOCUMENTS 6,624,999 B1 * 9/2003 Johnson .................. H01L 23/60
361/113
7,038,326 B2 * 5/2006 Poulin ..................... H01L 23/50
257/691
(Continued)

FOREIGN PATENT DOCUMENTS

| EP | 1 168 607 A2 | 1/2002 | |
| EP | 2 741 426 A1 | 6/2014 | |
| NL | EP 2924731 A1 * | 9/2015 | ............. H01L 23/13 |

OTHER PUBLICATIONS

European Search Report from related application 15186791.8 dated May 10, 2016.

*Primary Examiner* — Earl Taylor
(74) *Attorney, Agent, or Firm* — Knobbe Martens Olson & Bear LLP

(57) ABSTRACT

A high isolation wideband switch is disclosed. In one aspect, the switch includes an integrated circuit package having an integrated circuit die with a first plurality of leads that is positioned on a package substrate that has a second plurality of leads. The first leads of the integrated circuit die are connected to the second the leads of the package substrate via bond wires and a first electrical coupling occurs between the first leads and the integrated circuit die in response to an RF signal applied to the integrated circuit package. The bond wires have a second electrical coupling in response to the RF signal and the bond wires are arranged such that the second electrical coupling is matched to the first electrical coupling within a selected frequency band so as to reduce the overall electrical coupling of the integrated circuit package for RF signals within the selected frequency band.

17 Claims, 6 Drawing Sheets

(51) Int. Cl.
*H01L 23/64* (2006.01)
*H01L 23/00* (2006.01)
*H04B 1/40* (2015.01)

(52) U.S. Cl.
CPC ............ *H01L 23/645* (2013.01); *H01L 24/49* (2013.01); *H01L 24/48* (2013.01); *H01L 2223/6611* (2013.01); *H01L 2224/05553* (2013.01); *H01L 2224/48157* (2013.01); *H01L 2224/49171* (2013.01); *H01L 2224/49175* (2013.01); *H01L 2924/00014* (2013.01); *H01L 2924/10161* (2013.01); *H01L 2924/1421* (2013.01); *H04B 1/40* (2013.01)

(58) Field of Classification Search
CPC ... H01L 2223/6611; H01L 2224/48157; H01L 2224/49171; H01L 2224/49175; H01L 24/48; H01L 2924/00014; H01L 2924/1421; H04B 1/40
See application file for complete search history.

(56) References Cited

U.S. PATENT DOCUMENTS

| | | | | |
|---|---|---|---|---|
| 7,224,180 B2* | 5/2007 | Hargrove | ................ | H01L 23/60 326/26 |
| 7,295,161 B2* | 11/2007 | Gaucher | ................ | H01L 24/48 235/492 |
| 8,558,398 B1* | 10/2013 | Seetharam | ........ | H01L 23/49503 257/784 |
| 8,680,690 B1 | 3/2014 | Steeneken et al. | | |
| 9,209,118 B2* | 12/2015 | Cuoco | .................... | H01L 23/13 |
| 9,281,285 B1* | 3/2016 | Atesal | .................... | H01L 23/64 |
| 2002/0134993 A1* | 9/2002 | Leighton | ................ | H01L 23/64 257/177 |
| 2002/0190360 A1* | 12/2002 | Poulin | .................... | H01L 23/50 257/678 |
| 2002/0190389 A1* | 12/2002 | Koenck | ................. | H01L 23/495 257/773 |
| 2003/0214052 A1* | 11/2003 | Poulin | .................... | H01L 23/50 257/784 |
| 2006/0043609 A1* | 3/2006 | Brennan | ................ | H01L 23/66 257/784 |
| 2006/0290455 A1* | 12/2006 | Kim | ........................ | H01L 23/66 336/130 |
| 2008/0055015 A1* | 3/2008 | Blednov | ............. | H01F 17/0033 333/32 |
| 2008/0246547 A1* | 10/2008 | Blednov | ................ | H01L 23/66 331/109 |
| 2008/0291107 A1* | 11/2008 | Tsai | ........................ | H01Q 9/26 343/803 |
| 2008/0296050 A1 | 12/2008 | Uda et al. | | |
| 2009/0096068 A1* | 4/2009 | Sjoestroem | ............. | H01L 23/66 257/666 |
| 2009/0236701 A1 | 9/2009 | Sun et al. | | |
| 2010/0188164 A1* | 7/2010 | Blednov | ................ | H01L 23/66 333/109 |
| 2011/0122047 A1* | 5/2011 | Ma | ........................ | H01Q 19/005 343/915 |
| 2011/0221033 A1* | 9/2011 | Boulay | ................... | H01L 24/49 257/531 |
| 2012/0105304 A1* | 5/2012 | Ma | .......................... | H01L 23/66 343/906 |
| 2014/0132355 A1* | 5/2014 | Dupuis | ................... | H03F 3/195 330/298 |
| 2014/0167858 A1* | 6/2014 | Van Zuijlen | ............ | H01L 23/66 330/295 |
| 2015/0145601 A1* | 5/2015 | Moronval | ............... | H03F 3/211 330/295 |
| 2015/0270198 A1* | 9/2015 | Cuoco | ..................... | H01L 23/13 257/670 |
| 2016/0093579 A1* | 3/2016 | Atesal | ..................... | H01L 23/64 361/56 |
| 2016/0099220 A1* | 4/2016 | Atesal | ..................... | H01L 23/66 257/664 |

* cited by examiner

- Representative Bond shape

HIGH ISOLATION WIDEBAND SWITCH

CROSS-REFERENCE TO RELATED PATENT APPLICATION

This application claims the benefit of U.S. Provisional Application No. 62/058,507, filed Oct. 1, 2014, which is herein incorporated by reference in its entirety.

BACKGROUND OF THE INVENTION

Field of the Invention

The described technology generally relates to a high isolation wideband switch.

Description of the Related Art

Wideband control products, such as quad flat no lead (QFN) packages for switches or attenuators, include wire bonds to electrically connect a small integrated circuit (IC) die containing the switch or attenuator to a package substrate. In applications including such wideband control products, costs can be reduced by minimizing the IC die and package size. However, the isolation and loss parameters of the product are related to the size and spacing of the IC die, bond wires, and package. Two of the main contributing factors to isolation of the switch are on-die coupling and package crosstalk.

SUMMARY OF THE INVENTION

In one implementation, an embodiment of the invention comprises an integrated circuit package having an integrated circuit die with a first plurality of leads that is positioned on a package substrate that has a second plurality of leads. In this implementation, the first plurality of leads of the integrated circuit die are connected to the second plurality of the leads of the package substrate via bond wires and a first electrical coupling occurs between the first plurality of leads through the integrated circuit die in response to an RF signal applied to the integrated circuit package. The bond wires that interconnect the first plurality of leads and the second plurality of leads have a second electrical coupling in response to the RF signal and the bondwires are arranged such that the second electrical coupling is matched to the first electrical coupling within a selected frequency band so as to reduce the overall electrical coupling of the integrated circuit package for RF signals within the selected frequency band.

In one implementation, the integrated circuit die includes a first surface and a second surface that are located distal to each other and one of the bond wires comprises an RF input bond wire and another one of the bond wires comprises an RF output bond wire and the RF input bond wire is attached to a lead located on the integrated circuit die on the first surface and the RF output bond wires is attached to a lead located on the second surface. In one further implementation, the RF input and RF output bond wires are attached to the integrated circuit die so as to be located as far from each other.

In one implementation, the bond wires define a vertical portion that extends upwards from the first plurality of leads on the integrated circuit die and a horizontal portion that extends outward from the first plurality of leads on the integrated circuit die. In this implementation, the bond wires are positioned into a predetermined orientation so that the component of the electrical coupling between the horizontal bond wires reduces the overall electrical coupling of the integrated circuit within the selected frequency band.

In one implementation, the first electrical coupling of the integrated circuit package includes a capacitive coupling occurring between the RF input and output leads of the first plurality of leads on the integrated circuit die and an inductive coupling occurring between the horizontal portion of the RF input bond wire and the RF output bond wire. In this implementation, the horizontal components of the RF input bond wire and the RF output bond wire are angularly adjusted with respect to each other such that the inductive coupling is out of phase with the capacitive coupling between the RF input and output bond wires and the integrated circuit die. In one implementation, the relative angular orientation of the horizontal portions of the RF input and RF output bond wires are adjusted so as to define an isolation notch on an isolation graph as a result of the bond wire inductive coupling being out of phase with the die capacitive coupling on the integrated circuit die at about the selected frequency band.

In one implementation, the RF output bond wire is positioned proximate to a ground bond wire adjacent the RF output bond wire so as to reduce the inductive coupling between the RF input and output bond wires. The RF output bond wire is then oriented with respect to the RF input bond wire to reduce the overall electrical coupling of the integrated circuit package.

In another implementation, an embodiment of the invention comprises a radio frequency (RF) switch package having an integrated circuit (IC) die including an RF switch placed on a package substrate. The IC die is electrically connected to the package substrate via an RF input bond wire and an RF output bond wire. When an RF signal is applied to the RF switch package, a first electrical coupling is formed between the RF input and output bond wires and a second electrical coupling is formed in the IC die. In this implementation, the first electrical coupling between the RF input and output bond wires is selected to cancel out at least a portion the second electrical coupling of the IC die within a predetermined frequency range.

In one implementation, an integrated circuit (IC) package comprising an IC die comprising a plurality of first input leads and a plurality of first output leads, the first input leads respectively corresponding to the first output leads; a package substrate comprising a plurality of second input leads and a plurality of second output leads, the IC die being positioned on the package substrate; a plurality of bond wires respectively connecting: i) the first input leads to the second input leads and ii) the first output leads to the second output leads, wherein each corresponding pair of first input and output leads is configured to transmit a radio frequency (RF) signal therebetween, and wherein the bond wires are arranged so as to define an isolation notch on an isolation graph for a selected frequency band of each RF signal as a result of the electrical coupling due to the transmission of the RF signals.

For purposes of summarizing the invention and the advantages achieved over the prior art, certain objects and advantages of the invention have been described herein. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description having reference to the attached figures, the invention not being limited to any particular embodiment(s) disclosed.

BRIEF DESCRIPTION OF THE DRAWINGS

These aspects and others will be apparent from the following detailed description and the accompanying drawing, which is meant to illustrate and not to limit the invention, wherein.

DETAILED DESCRIPTION

Various embodiments disclosed herein relate to the electrical connections between IC dies and package substrates having improved isolation. An IC die can be mounted on a package substrate to electrically communicate with a larger electronic device or system via the package. In the following embodiments, a radio frequency (RF) switch is described in detail as an exemplary embodiment of the IC die. However, the IC dies disclosed herein can include any suitable type of IC die, such as an attenuator, which is commonly used in applications such as transceivers, sources, analyzers, etc. The IC die may be packaged in a package body using various packaging techniques. The packaged integrated device can be mounted to a system board for integration into a larger electronic device or system.

In some implementations, the IC die is connected to a package substrate via a plurality of wire bonds. The wire bonds form an electrical connection between the leads of the IC die and the leads of the package substrate. Various design considerations in the manufacture of the IC die and package substrate affect the isolation and loss (or gain) of the package. For example, the insertion loss and isolation of the package can be altered due to the on-die coupling or package crosstalk. This will be described in greater detail below with reference to the figures.

Figure 1:
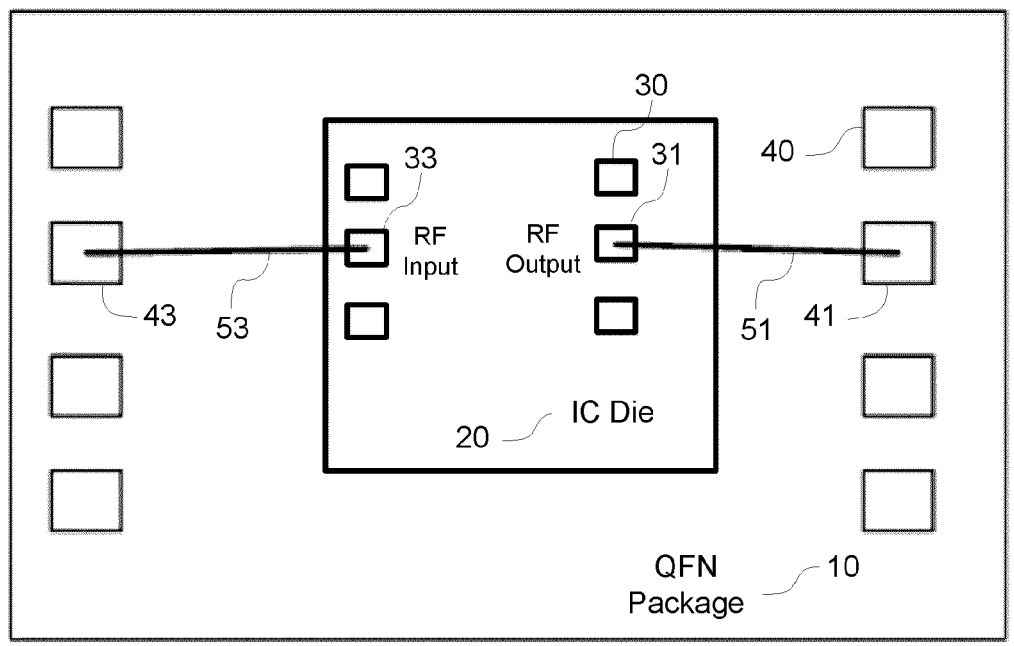
FIG. 1 is a diagram illustrating the bond wire connections between an IC die and a QFN package substrate according to an embodiment.

FIG. 1 is a diagram illustrating the bond wire connections between an IC die and a QFN package substrate according to an embodiment. In the FIG. 1 embodiment, the IC die 20 includes a plurality of leads 30 including an RF input lead 33 and an RF output lead 31. The QFN package substrate also includes a plurality of leads 40 which are electrically connected to the leads 30 of the IC die 20 via a plurality of bond wires 51 and 53. In the embodiment illustrated in FIG. 1, the RF input and output leads 33 and 31 of the IC die 20 are respectively connected to the QFN package substrate 10 via an RF input bond wire 53 and an RF output bond wire 51.

In the embodiment of FIG. 1 and the following description, the IC die 20 is described as being embodied by an RF switch which is connected to a QFN package 10. However, the embodiments of the described technology are not limited thereto and the IC die 20 may be any suitable type of IC die 20 connected to any type of suitable package substrate. In the following description, the term RF switch may be used to refer to the IC die 20 itself or to the overall package including the IC die 20, the bond wires 51 and 53, and the QFN package 10.

Figure 2:
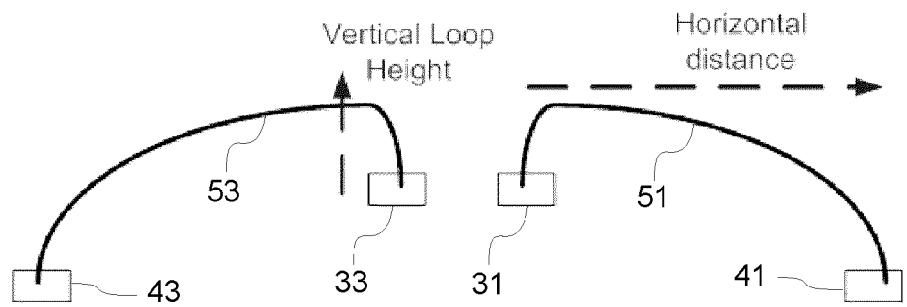
FIG. 2 is a side view illustrating an exemplary wire bond shape according to an embodiment.

FIG. 2 shows an exemplary wire bond shape according to an embodiment. FIG. 2 is a side view of the RF input and output bond wires 53 and 51, the RF input and output leads 33 and 31, and QFN package input and output leads 43 and 41. FIG. 2 illustrates an exemplary geometry of the RF input and output bond wires 53 and 51, however, the illustrated bond wire shape may be applied to any of the bond wires 51 and 53. In order to form the electrical connections between the leads 30 and 40 of the IC die 20 and the QFN package substrate 10, the bond wires 53 and 51 first extend from the IC die leads 33 and 31 in a substantially vertical direction and then extend substantially horizontally to the QFN package leads 43 and 41. The shape of the bond wires 53 and 51 shown in FIG. 2 is merely one embodiment and the shape of the bond wires 51 and 53 is not limited to the illustrated shape.

Figure 3:
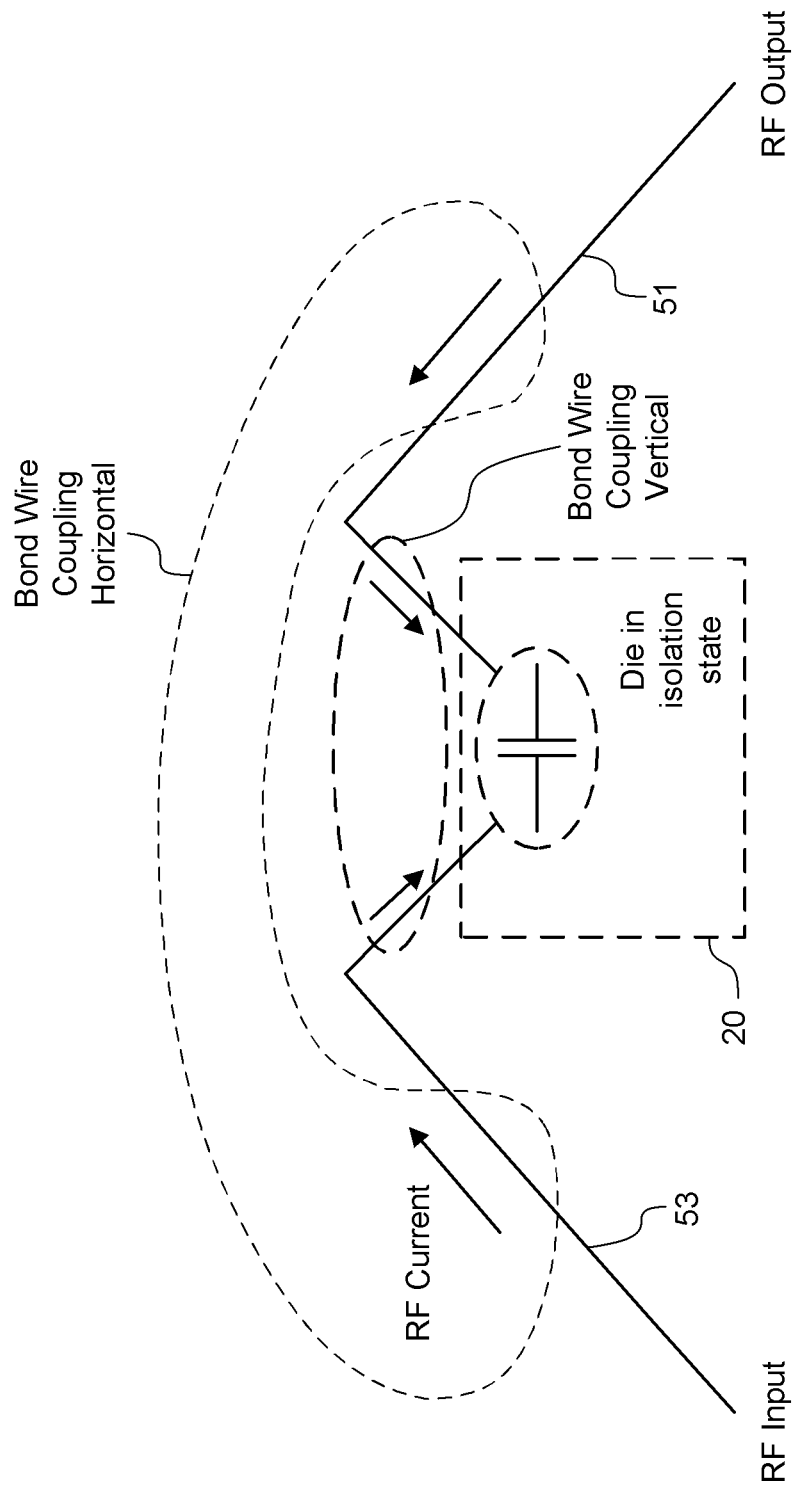
FIG. 3 is a diagram illustrating example sources of coupling in an IC package according to an embodiment.

FIG. 3 is a diagram illustrating example sources of signal coupling in an IC package according to an embodiment. When an RF signal is transmitted through the RF input and output bond wires 53 and 51, the physical structure of the bond wires 53 and 51 and IC die 20 introduces coupling in the signal which can have a negative impact on the isolation of the RF switch package. FIG. 3 conceptually illustrates three different sources of coupling that can occur in-between the RF input and output bond wires 53 and 51. The coupling of the IC die 20 itself can be modeled as capacitive coupling between the leads 33 and 31 of the IC die 20. The IC die 20 coupling may be referred to as on-die coupling and the coupling results from the finite off-state capacitance of the RF switch.

Additionally, signal coupling is introduced between the RF input and output bond wires 53 and 51 and can be conceptually divided into coupling generated due to the vertical portions of the bond wires 53 and 51 and coupling generated due to the horizontal portions of the bond wires 53 and 51. The coupling between the RF input and output bond wires 53 and 51 can be modeled as inductive coupling. The inductive coupling between the vertical portions of the RF input and output bond wires 53 and 51 enhances the capacitive on-die coupling of the IC die 20. Accordingly, in at least one embodiment, the geometry of the horizontal portions of the RF input and output bond wires 53 and 51 is manipulated to offset the combined capacitive coupling of the IC die 20 and the vertical portions of the RF input and output bond wires 53 and 51.

In the standard RF switch, each of these three sources of signal coupling is individually minimized so as to minimize the overall coupling of the RF switch. One method of reducing the coupling between the RF input and output bond wires 53 and 51 is to maximize the spacing between the bond wires 53 and 51. However, this technique is limited by the sizes of the package 10, paddle (not shown), and IC die 20. For example, as the overall size of the RF switch decreases, the maximum distance at which the RF input and output bond wires 53 and 51 can be spaced may not sufficiently limit the coupling between the bond wires 55 and 51 to obtain a desired isolation bandwidth. Additionally, IC die coupling can be reduced by changing the size of the IC die 20 or decreasing the effective off state capacitance of the switch circuit, however, this can have a negative impact on other performance parameters of the RF switch such as insertion loss and power handling, thus resulting in limited isolation between the RF input and output ports of the package. Effects on the isolation of the RF switch may also be addressed by changing the packaging technology used (e.g., by using flip-chip packages), however, these changes increase both the cost and complexity of the switch.

Figure 4:
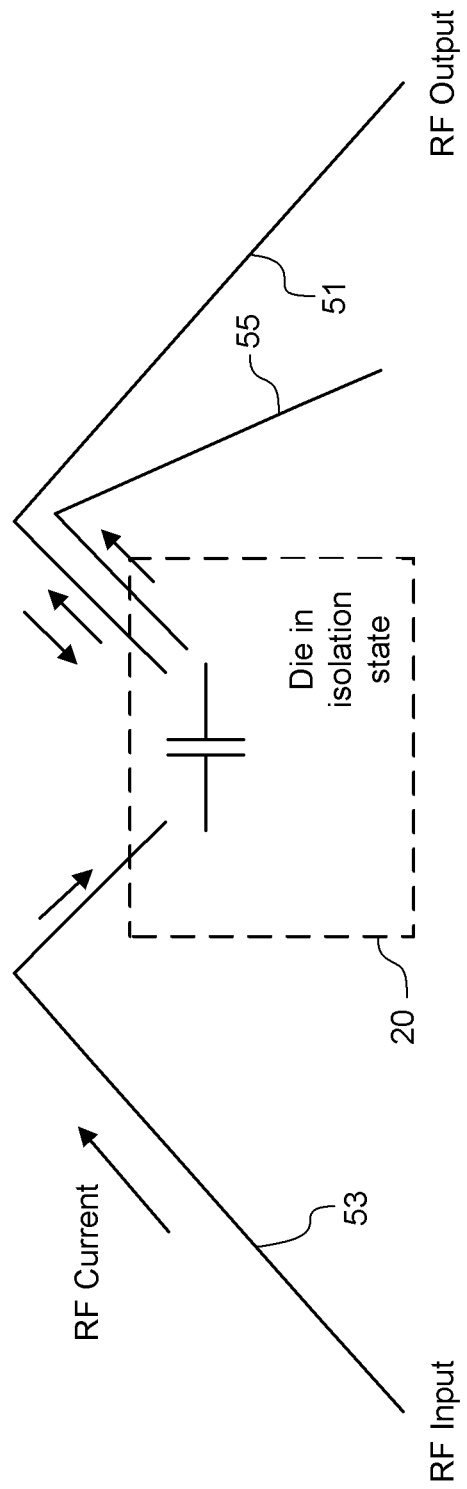
FIG. 4 is a diagram illustrating one method of altering the coupling between bond wires according to an embodiment.

Another method used to minimize signal coupling is shown in FIG. 4. FIG. 4 is a diagram illustrating one method of altering the coupling between bond wires according to an embodiment. In this embodiment, the coupling between the bond wires 51 and 53 can be reduced by placing a ground bond 55 in close proximity to one of the bond wires 51 or 53 with a termination. In one example, the termination is a 50 Ohms termination. In the example shown in FIG. 4, the ground bond 55 is placed near the RF output bond wire 51. Here, the current input into the RF input bond wire 53 induces a current in the ground bond 55, which in turn induces a reverse current in the RF output bond wire 51, thus canceling the coupling between the RF input and output bond wires 53 and 51.

Referring back to FIG. 3, in certain embodiments, the configuration or geometry of the bond wires 51 and 53 is selected such that the inductive coupling generated in the bond wires 51 and 53 cancels the capacitive coupling generated in the IC die 20. Thus, instead of minimizing each of the coupling sources, the coupling from the bond wires 51 and 53 is manipulated by altering the geometry of the bond wires 51 and 53 such that it is substantially out of phase with the coupling introduced due to the IC die 20. In particular, over the frequency band of interest for the RF switch, the coupling introduced by the bond wires 51 and 53 is selected to be substantially out of phase with and to have a magnitude that is similar to the coupling introduced by the IC die 20. Depending on the design requirements of the RF switch, the phase and magnitude of the bond wire coupling can be selected to introduce a notch in the isolation graph of the switch in a desired frequency band. By introducing the notch into the isolation graph, the isolation bandwidth can be increased over traditional isolation methods.

The phase and magnitude of the coupling between the bond wires 51 and 53 is a function of the bond wire geometry. Thus, these parameters of the signal coupling between the bond wires 51 and 53 can be selected by adjusting, for example, the angle, length, and/or orientation of the bond wires 51 and 53. However, the described technology is not limited to adjusting the above described geometric characteristics. Any design factors that affect the coupling of the bond wires 51 and 53 can be used to adjust the phase and magnitude of coupling in the bond wires 5. For example, as illustrated in FIG. 4, a ground bond 55 can be placed near one of the bond wires 51 and 53. In this implementation, the magnitude of the coupling between the bond wires 51 and 53 can be reduced due to the current induced in the ground bond 55. Additionally, any design factors which affect the coupling introduced by the IC die 20 can be adjusted to cancel the overall signal coupling with the bond wires 51 and 53. Accordingly, any such design factors which affect the phase and amplitude of the coupling of the RF bond wires 51 and 53 and/or the IC die 20 are considered to be within the scope of the described technology.

Figure 5:
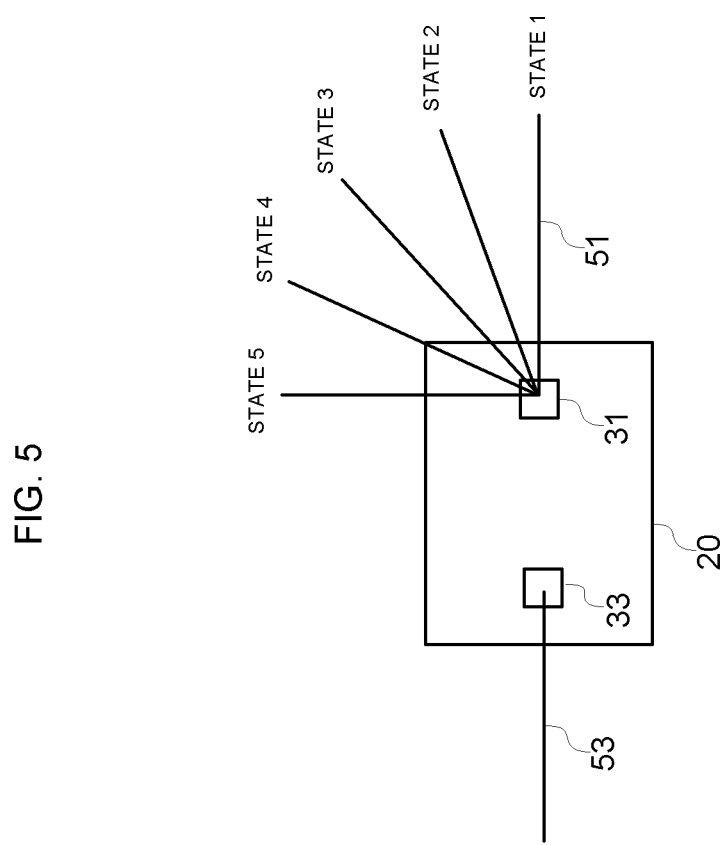
FIG. 5 is a diagram illustrating various RF output bond wire configurations according to an embodiment.

FIG. 5 is a diagram illustrating various RF output bond wire configurations according to an embodiment. FIG. 5 illustrates a top view of the IC die 20, RF input and output leads 33 and 31, and RF input and output bond wires 53 and 51. The angle between the RF input and output bond wires 53 and 51 is adjusted to form a number of states (state 1 to state 5) by changing the angle of the RF output bond wire 51. In state 1, the RF output bond wire 51 forms a 180° angle with respect to the RF input bond wire 51. In state 5, the RF input and output bond wires 53 and 51 form a 90° angle. Similarly, in states 2, 3, and 4, the RF input and output bond wires 53 and 51 respectively form angles of about 157.5°, 135°, and 112.5°.

Figure 6:
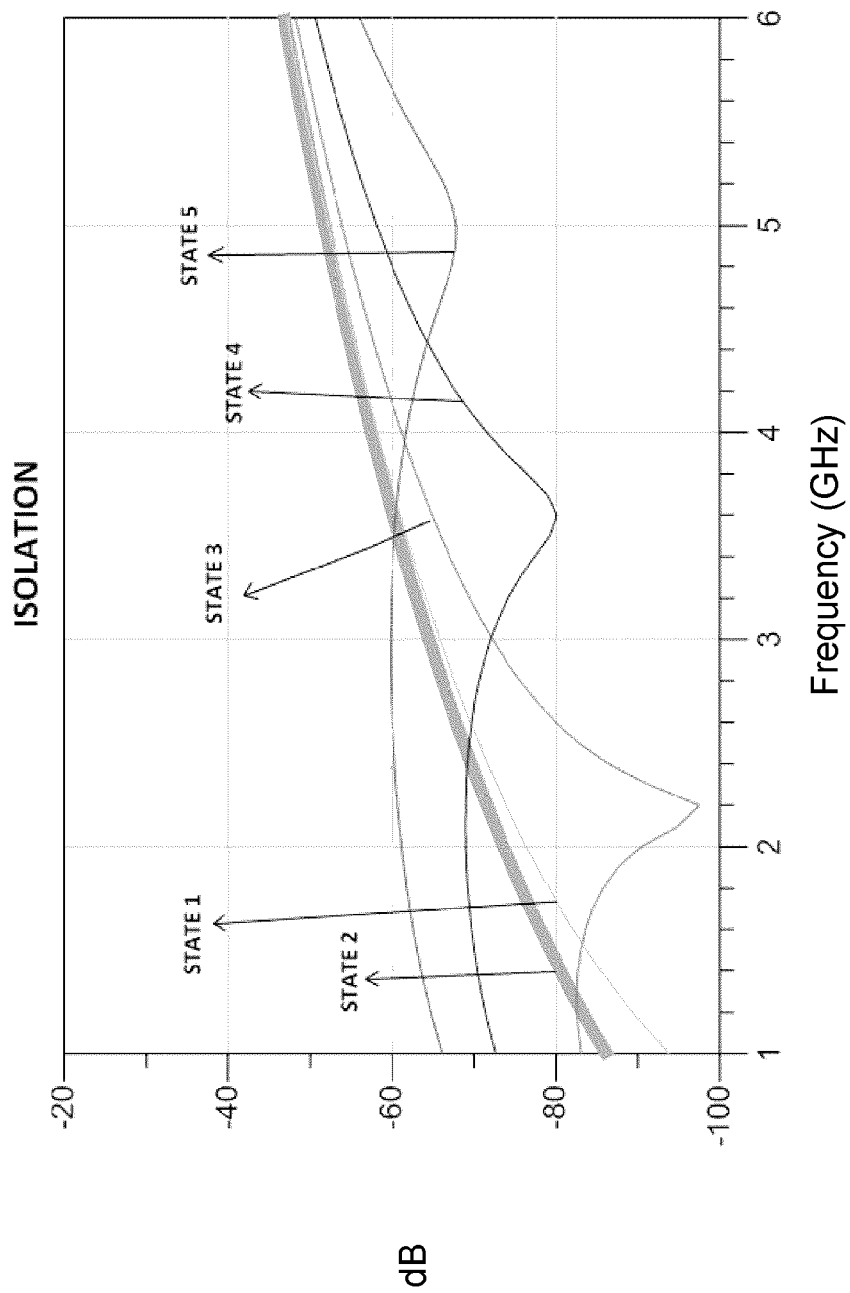
FIG. 6 is a graph illustrating the isolation of the RF output bond wire configurations illustrated in FIG. 5.

FIG. 6 is a graph illustrating the isolation of the RF bond wire configurations of FIG. 5. The graph illustrated in FIG. 6 show the isolation in dB for a plurality of RF switches in which the angle of the RF output bond wire 5 is adjusted between states 1 and 5, as shown in FIG. 5.

As shown in the plots of the states 1 to 5, the notch in the isolation graph changes based on the angle the RF output bond wire 51 makes with the RF input bond wire 53. As the RF output bond wire 53 approaches an orthogonal orientation with respect to the RF input bond wire 51, the coupling between the RF bond wires 53 and 51 increases in the low frequency region (i.e., in the 1-2 GHz region). As shown in the plot of state 3, a notch is formed in the isolation over frequency performance at the point where the bond wire coupling is out of phase with the IC die coupling and the magnitudes of the bond wire and IC die coupling are similar. The notches in each of states 4 and 5 are formed at increasing frequencies. Thus, as shown in the isolation graph of FIG. 6, while the frequency isolation degrades in the lower frequency region, a wider band of frequency isolation can be obtained by outphasing the isolations from the two mechanisms thus introducing an isolation notch in the isolation over frequency performance.

At each of the notches in the isolation graph of FIG. 6, the overall electrical coupling of the IC package is reduced compared to the adjacent frequencies. Thus, the term reduced as used in this disclosure may refer to the reduction of electrical coupling of the IC package for a selected frequency band with respect to frequencies that are adjacent to the selected frequency band. According to at least one embodiment, a reduction in electrical coupling, e.g., an isolation notch, is produced due to cancelling between different sources of electrical coupling. When the different coupling sources are out of phase with each other, the overall coupling of the IC package will be reduced for a certain frequency range.

According to at least one embodiment, the geometry of the bond wires 53 and 51 is selected to increase the isolation bandwidth of an RF switch. This appears as an isolation notch within the bandwidth. In multi-pole RF switch packages, the effects may appear as a plurality of isolation notches within the desired bandwidth.

Figure 7:
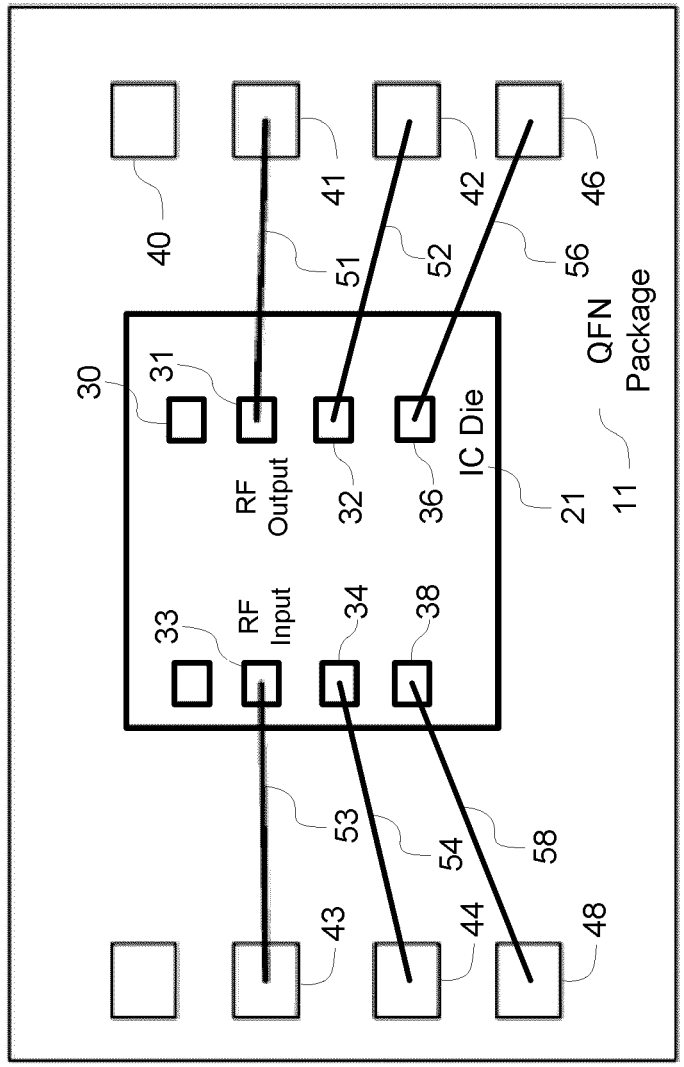
FIG. 7 is a diagram illustrating the bond wire connections between an IC die and a QFN package substrate according to an embodiment.

FIG. 7 is a diagram illustrating the bond wire connections between an IC die and a QFN package substrate according to an embodiment. Specifically, the embodiment of FIG. 7 includes a QFN package 11 having an IC die 21. The IC die 21 includes a plurality of leads 30 including a plurality of RF input leads 32, 34, and 38 and a plurality of RF output leads 31, 32, and 36. The QFN package also includes a plurality of leads 40 which are electrically connected to the leads 30 of the IC die 21. Specifically, RF input leads 33, 24, and 38 are respectively connected to the QFN package leads 43, 44, and 48 via bond wires 53, 54, and 58 and the RF output leads 31, 32, and 36 are respectively connected to the QFN package leads 41, 42, and 46 via bond wires 51, 52, and 56.

In the illustrated embodiment, the IC die 21 connects a plurality RF input and output leads 31 to 38 which may experience electrical signal coupling. In particular, each of the bond wires 51 to 58 may include electrical signal coupling with the other bond wires 51 to 58 due to the RF signals applied thereto. Further, as described above in connection with FIG. 3, the bond wires 51 to 58 may experience inductive and capacitive coupling due to the geometry of the bond wires 51 to 58, for example, due to the vertical and horizontal portions of the bond wires 51 and 58, and may further experience capacitive coupling generated in the IC die 21.

In some embodiments, the geometry and positioning of each of the bond wires 51 to 58 is selected such that the inductive and capacitive coupling generated in the bond wires 51 to 58 cancels at least a portion of the capacitive coupling generated in the IC die 21. Since each of the bond wires 51 to 58 may be inductively or capacitively coupled to each of the other bond wires 51 to 58, the selected geometry may be based on the location and geometry of the other bond wires 51 to 58. Additionally, the notches in the isolation graphs for each pair of bond wires 51 to 58 can be selected by altering the geometry and positioning of the bond wires 51 to 58 based on the intended operating frequency band for the pair of bond wires 51 to 58.

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, medical devices, a mobile phone, a telephone, a tablet computing device, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a washer, a dryer, a washer/dryer, a copier, a facsimile machine, a scanner, a multi-functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated circuit (IC) package comprising:
   an IC die comprising a first plurality of leads, the IC die being configured to operate within a selected frequency band;
   a package substrate comprising a second plurality of leads, the IC die being positioned on the package substrate;
   a plurality of bond wires respectively connecting the first leads to the second leads, the bond wires comprising an RF input bond wire and an RF output bond wire,
   wherein a first electrical coupling occurs between the first plurality of leads connected to the RF input and output bond wires through the IC die in response to a radio frequency (RF) signal applied to the IC package via the RF input bond wire, the RF signal having a value within the selected frequency band,
   wherein the RF input and output bond wires have a second electrical coupling in response to the RF signal applied to the RF input bond wire, and
   wherein the angle between the RF input and output bond wires is selected such that the second electrical coupling is substantially matched to and out of phase with the first electrical coupling in response to the applied RF signal being within the selected frequency band, the substantial matching of the first and second electrical couplings reducing electrical coupling of the IC package for RF signals within the selected frequency band compared to RF signals adjacent to the selected frequency band, the electrical coupling of the IC package comprising the first and second electrical couplings.

2. The IC package of claim 1, wherein the IC die includes a first surface and a second surface that are located distal to each other, the RF input bond wire being attached to an RF input lead of the first leads located on the first surface of the IC die and the RF output bond wire being attached to an RF output lead of the first leads located on the second surface of the IC die.

3. The IC package of claim 2, wherein the RF input bond wire and the RF output bond wire are attached to the IC die so as to be located at a maximum distance from each other within the IC package.

4. The IC package of claim 2, wherein each of the bond wires defines a vertical portion that extends from the first leads on the IC die and a horizontal portion that extends outward from the first leads on the IC die and wherein the bond wires are positioned into a predetermined orientation so that the component of the electrical coupling between the horizontal bond wires reduces the electrical coupling of the IC package within the selected frequency band.

5. The IC package of claim 4, wherein the first electrical coupling of the IC package includes a capacitive coupling component occurring between the RF input and output leads on the IC die and an inductive coupling component occurring between the horizontal portions of the RF input bond wire and the RF output bond wire.

6. The IC package of claim 5, wherein the relative angular orientation of the horizontal portions of the RF input and RF output bond wires is selected to define an isolation notch on an isolation graph as a result of the bond wire inductive coupling component being out of phase with the capacitive coupling component on the IC die at about the selected frequency band in response to the applied RF signal being within the selected frequency band.

7. The IC package of claim 2, wherein the RF output bond wire is positioned proximate to a ground bond wire adjacent the RF output bond wire with a 50 Ohm termination in between so as to reduce inductive coupling between the RF input and output bond wires, the RF output bond wire being oriented with respect to the RF input bond wire so as to reduce the electrical coupling of the IC package.

8. A radio frequency (RF) switch package, comprising:
a package substrate; and
an integrated circuit (IC) die including an RF switch, the IC die being placed on the package substrate, and the IC die being configured to operate within a predetermined frequency range,
wherein IC die is electrically connected to the package substrate via an RF input bond wire and an RF output bond wire,
wherein when an RF signal is applied to the RF switch package via the RF input bond wire, a first electrical coupling is formed between the RF input and output bond wires and a second electrical coupling is formed in the IC die,
wherein the angle between the RF input and output bond wires is selected such that the first electrical coupling between the RF input and output bond wires is substantially matched to and out of phase with the second electrical coupling of the IC die within the predetermined frequency range,
wherein the substantial matching of the first and second electrical couplings reduces electrical coupling of the RF switch package for RF signals within the predetermined frequency range compared to RF signals adjacent to the predetermined frequency range, the electrical coupling of the RF switch package comprising the first and second electrical couplings.

9. The RF switch package of claim 8, wherein the RF input bond wire and the RF output bond wire are attached to the IC die so as to be located at a maximum distance from each other within the RF switch package.

10. The RF switch package of claim 8, wherein each of the bond wires defines a vertical portion that extends from the IC die and a horizontal portion that extends outward from the IC die and wherein the bond wires are positioned into a predetermined orientation so that the component of the electrical coupling between the horizontal bond wires reduces the electrical coupling of the RF switch package within the predetermined frequency range.

11. The RF switch package of claim 10, wherein the first electrical coupling includes a capacitive coupling component occurring between the RF input and output bond wires on the IC die and an inductive coupling component occurring between the horizontal portions of the RF input and output bond wires, wherein the horizontal components of the RF input bond wire and the RF output bond wire are angularly adjusted with respect to each other such that the inductive coupling component is out of phase with the capacitive coupling component between the RF input and output bond wires and the IC die.

12. The RF switch package of claim 11, wherein a relative angular orientation of the horizontal portions of the RF input and RF output bond wires is selected to define an isolation notch on an isolation graph as a result of the bond wire inductive coupling component being out of phase with the capacitive coupling component on the IC die at about the predetermined frequency range in response to the applied RF signal being within the selected frequency band.

13. The RF switch package of claim 8, wherein the RF output bond wire is positioned proximate to a ground bond wire adjacent the RF output bond wire so as to reduce the inductive coupling between the RF input and output bond wires, the RF output bond wire being oriented with respect to the RF input bond wire so as to reduce the electrical coupling of the RF switch package.

14. An integrated circuit (IC) package comprising:
an IC die comprising a plurality of first input leads and a plurality of first output leads, the first input leads respectively corresponding to the first output leads, the IC die being configured to operate within a selected frequency band;
a package substrate comprising a plurality of second input leads and a plurality of second output leads, the IC die being positioned on the package substrate;
a plurality of bond wires respectively connecting: i) the first input leads to the second input leads and ii) the first output leads to the second output leads, the bond wires comprising a radio frequency (RF) input bond wire and an RF output bond wire,
wherein the first input and output leads connected to the RF input and output bond wires are configured to transmit an RF signal therebetween,
wherein a first electrical coupling occurs between the first input and output leads connected to the RF input and output bond wires in the IC die in response to the RF signal applied to the RF input bond wire,
wherein a second electrical coupling occurs between the RF input and output bond wires in response to the RF signal applied to the RF input bond wire,
wherein the angle between the RF input and output bond wires is selected to define an isolation notch on an isolation graph for the selected frequency band as a result of electrical coupling due to the transmission of the RF signal, the first electrical coupling is substantially matched to and out of phase with the second electrical coupling to form the isolation notch.

15. The IC package of claim 14, wherein each of the bond wires defines a vertical portion that extends from the corresponding lead on the IC die and a horizontal portion that extends outward from the corresponding lead on the IC die and wherein the RF input and output bond wires are positioned into a predetermined orientation so that the component of the electrical coupling between the horizontal bond wires reduces the electrical coupling of the IC package within the selected frequency band.

16. The IC package of claim 14, wherein the first electrical coupling of the IC die includes a capacitive coupling component occurring between the first input and output leads connected to the RF input and output bond wires on the IC die and an inductive coupling component occurring between the horizontal portions of the RF input and output bond wires, wherein an angle formed between the horizontal components of the RF input and output bond wires with respect to each other is selected such that the inductive coupling component is out of phase with the capacitive coupling component between the first input and output bond wires connected to the RF input and output bond wires and the IC die in response to the applied RF signal being within the selected frequency band.

17. The IC package of claim 16, wherein a relative angular orientation of the horizontal portions of the RF input and output bond wires is selected to define the isolation notches on the isolation graph as a result of the bond wire inductive coupling component being out of phase with the capacitive coupling component on the IC die at about the selected frequency bands in response to the applied RF signal being within the selected frequency band.

* * * * *